United States Patent
Iizuka

(10) Patent No.: US 7,248,538 B2
(45) Date of Patent: Jul. 24, 2007

(54) SEMICONDUCTOR MEMORY DEVICE

(75) Inventor: Mariko Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/344,206

(22) Filed: Feb. 1, 2006

(65) Prior Publication Data

US 2006/0171238 A1    Aug. 3, 2006

(30) Foreign Application Priority Data

Feb. 2, 2005    (JP) .............................. 2005-026712

(51) Int. Cl.
*G11C 8/00*    (2006.01)
(52) U.S. Cl. ............. 365/233; 365/189.01; 365/189.05
(58) Field of Classification Search ................ 365/233
See application file for complete search history.

(56) References Cited

U.S. PATENT DOCUMENTS 6,160,275 A * 12/2000 Nishio et al. ............... 257/206

7,164,601 B2 * 1/2007 Mitani et al. ........... 365/185.03

OTHER PUBLICATIONS

U.S. Appl. No. 11/344,206, filed Feb. 1, 2006, Iizuka.
U.S. Appl. No. 11/344,016, filed Feb. 1, 2006, Kaku.

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes an interface unit connected to an external circuit, a data memory unit including a write data line, a read-out data line, a data control unit, and a memory block connected to the data control unit, and a read-out latch block connected between a read-out data line and the interface unit. The data control unit outputs data read out of the memory block to the read-out data line with a trailing edge of a clock being used as a trigger. The read-out latch block latches the data with a trailing edge of another clock, which is generated at least one cycle after the trailing edge of the aforementioned clock, being used as a trigger. The interface unit outputs the data to the external circuit with a leading edge of still another clock, which follows the aforementioned another clock, being used as a trigger.

20 Claims, 10 Drawing Sheets

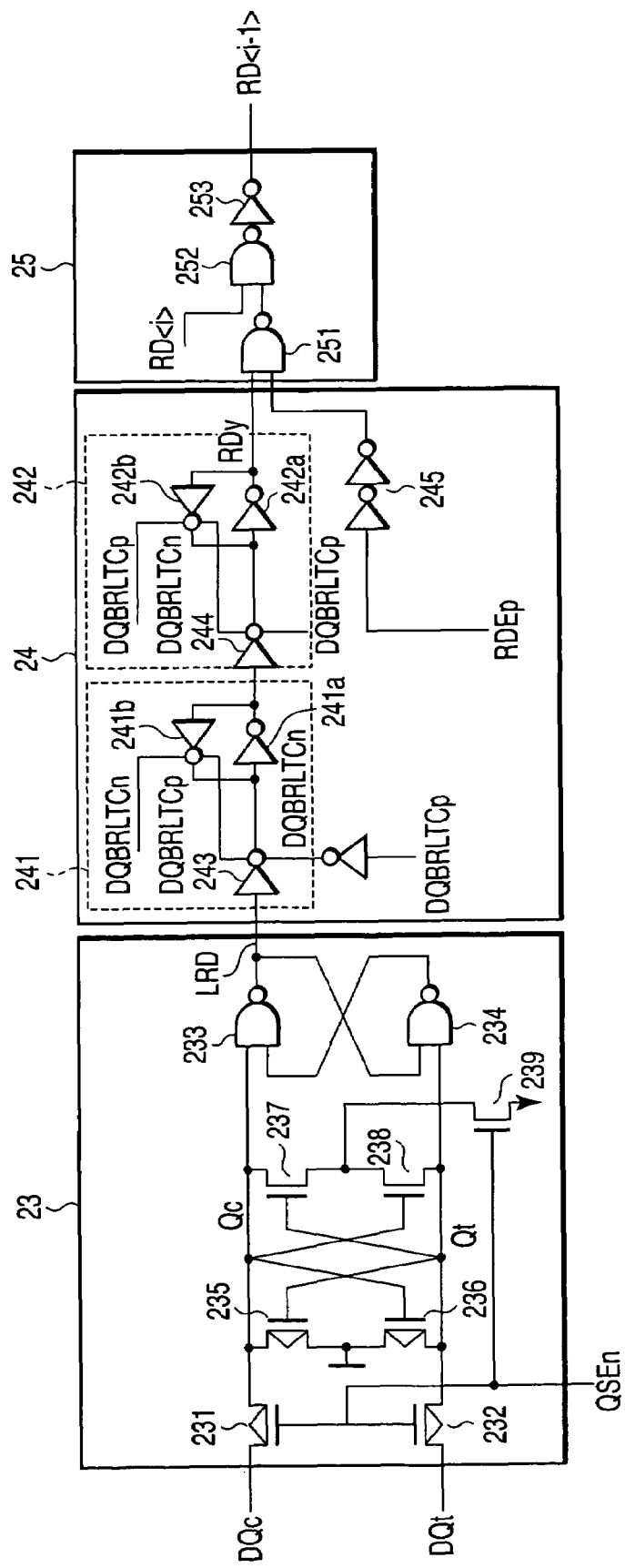
F I G. 7

(a) CLK
(b) QSEn
(c) LRD
(d) RD
(e) IORLTCp<0>
(f) RDx
(g) IORLTCp<1>
(h) DOUT

SEMICONDUCTOR MEMORY DEVICE

CROSS-REFERENCE TO RELATED APPLICATIONS

This application is based upon and claims the benefit of priority from prior Japanese Patent Application No. 2005-026712, filed Feb. 2, 2005, the entire contents of which are incorporated herein by reference.

BACKGROUND OF THE INVENTION

1. Field of the Invention

The present invention relates to a large-capacity semiconductor memory device that has a structure similar to, for example, the structure of an eDRAM (embedded Dynamic Random Access Memory), wherein a plurality of memory blocks are mounted on a semiconductor substrate with respect to an I/O block.

2. Description of the Related Art

A large-capacity semiconductor memory device that is constructed, for example, like an eDRAM, which comprises an I/O block and a plurality of memory blocks, is called a large-capacity memory macro. A conventional large-capacity memory macro has a structure, for example, as shown in FIG. 17. In FIG. 17, a plurality of memory blocks 204<0> to 204<3> are connected to a DQB block 203, which is a data control unit, via local or complementary data lines DQt/c. The DQB block 203, in turn, is connected to an I/O block. Write data from outside is supplied as input data DIN. The write data is then delivered from the I/O block 201 to the DQB block 203. Subsequently, the write data is selectively written in any one of the memory blocks 204<0> to 204<3> via the data lines DQt/c. For example, in the case of an eDRAM, each memory block has a sense amplifier unit that is connected to the data lines DQt/c, and a memory array. Write data that is sent to the data lines DQt/c is written in the memory array by the sense amplifier unit. In addition, read-out data, which is selectively read out of any one of the memory blocks 204<0> to 204<3>, is delivered to the DQB block 203 over the data lines DQt/c. For example, in the case of the eDRAM, read-out data is read out from the memory array, which is included in the memory block, to the sense amplifier unit and is amplified. The amplified data is delivered to the DQB block over the data lines DQt/c. The read-out data, which has been read out to the DQB block 203, is re-amplified and is delivered to, and latched in, the I/O block. The latched data is output as output data DOUT.

In general, if the capacity of the memory macro increases, the length of data lines also increases, leading to a serious problem in the high-speed operation of the memory macro. It is thus imperative for the large-capacity memory macro to suppress an increase in data line length. In order to solve this problem, the data line control would become complex in many cases. The complex data line control will increase the circuit area of the DQB block and, as a result, the area of the memory macro will increase.

BRIEF SUMMARY OF THE INVENTION

According to an aspect of the present invention, there is provided a semiconductor memory device comprising: an interface unit that executes transmission/reception of data with an external circuit; a data memory unit including a write data line, a read-out data line, a data control unit connected to the interface unit via the write data line, and a memory block connected to the data control unit; and a read-out latch block that is connected between the read-out data line and the interface unit, wherein the data control unit outputs data, which is read out of the memory block, to the read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

According to another aspect of the present invention, there is provided a semiconductor memory device comprising:

an interface unit that executes transmission/reception of data with an external circuit;

a data memory unit including a write data line, a read-out data line, a plurality of data control units commonly connected to the interface unit via the write data line, and a plurality of memory blocks each connected to the data control units, respectively; and a read-out latch block that is connected between the read-out data line and the interface unit, wherein the read-out data line is commonly connected to the plurality of data control units, a selected one of the data control units outputs read data, which is read out of a corresponding one of the memory blocks associated with the selected one of the data control units, to the read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

According to further aspect of the present invention, there is provided a semiconductor memory device comprising:

an interface unit that executes transmission/reception of data with an external circuit;

a data memory unit including a write data line, a plurality of read-out data lines, a plurality of data control units commonly connected to the interface unit via the write data line, a plurality of memory blocks connected to the plurality of data control units, respectively, and each of the plurality of read-out data lines being connected between a preceding data control unit and a nest data control unit; and a read-out latch block that is connected between the interface unit and one of the plurality of data control units provided adjacent to the interface unit, wherein a selected data control unit of the data control units outputs data, which is read out of a memory block corresponding to the selected data control unit, to the corresponding read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

BRIEF DESCRIPTION OF THE SEVERAL VIEWS OF THE DRAWING

FIG. 7 is a block diagram that shows a specific example of the structures of circuit blocks shown in FIG. 6;

DETAILED DESCRIPTION OF THE INVENTION

Prior to describing embodiments of the present invention, a description is first given of a reference example, on which the present invention is based.

Figure 1:
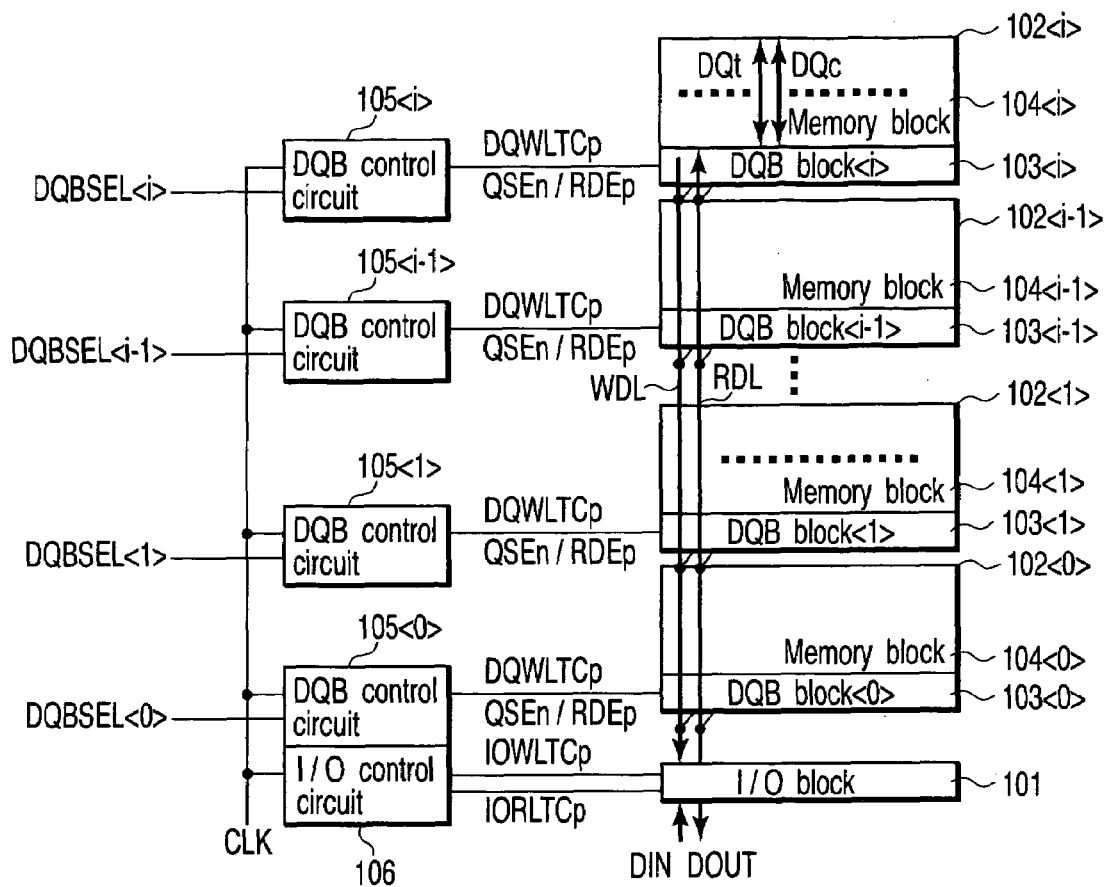
FIG. 1 is a block diagram that shows the entire structure of a reference example, which is a presupposed technique of the present invention.

FIG. 1 is a block diagram that schematically shows the entire structure of a memory macro according to the reference example.

In a conventional memory macro, data lines that connect a DQB block and memory blocks are connected to all the memory blocks. As a result, a very large parasitic capacitance occurs. An increase in parasitic capacitance and resistance of data lines due to an increase in memory capacitance of the memory macro causes a serious problem in the high-speed operation of the memory macro.

The structure shown in FIG. 1 relates to an example of the memory macro that is designed to achieve an object to suppress an increase in wiring length of data lines that connect the DQB block and the memory blocks, which is caused by the increase in capacity of the memory macro. The memory macro is divided into a plurality of sub-macros, and each sub-macro is provided with a DQB block and local data lines. Thereby, this object is achieved. In FIG. 1, data write/read-out between the DQB blocks and the I/O block is executed over global data lines.

The reference example shown in FIG. 1 will be described in detail. The memory macro is structured such that an I/O block 101 and memory sub-macros 102<0>, 102<1>, ..., 102<i> neighbor in succession. For example, a memory sub-macro 102<0> comprises a DQB block 103<0> that is a data control unit, and a memory block 104<0> that is provided in association with the DQB block 103<0>. Similarly, the other memory sub-macros 102<1>, ..., 102<i> comprise DQB blocks 103<1> to 103<i> and memory blocks 104<1> to 104<i>, respectively.

Local data lines are connected to the DQB block 103<i>. The local data lines are complementary in this example, and the DQB block 103<i> is connected to the associated memory block via complementary local data lines DQt, DQc. Similarly, the other DQB blocks 103<0>, 103<1>, ..., 103<i-1> are connected to the associated memory blocks via complementary local data lines.

The operations of the DQB blocks 103<0> to 103<i> are controlled by control signals DQWLTCp, QSEn and RDEp from DQB control circuits 105<0> to 105<i> that are operated by a clock CLK. The data latch operation of the I/O block 101 is controlled by latch control signals IOWLTCp, IORLTCp from an I/O control circuit 106.

The I/O block 101 is commonly connected over a write global data line WDL to the DQB blocks 103<0>, 103<1>, ..., 103<i-1> and 103<i> that are data control units in the memory sub-macros 102<0>, 102<1>, ..., 102<i-1> and 102<i>. DIN, that is, write data WD supplied from outside, is sent to the global data line WDL via the I/O block 101. Further, the write data WD is selectively supplied to the DQB block 103<0> to 103<i> of the memory sub-macros 102<0> to 102<i>, and written in any one of the associated memory blocks 104<0> to 104<i>. At a time of data read-out, read-out data RD, which is read out of a selected one of the memory blocks 104<0> to 104<i>, is sent to a read-out global data line RDL via the associated DQB block. After the read-out data RD is latched in the I/O block 101, it is output as output data DOUT to the outside.

Figure 4:
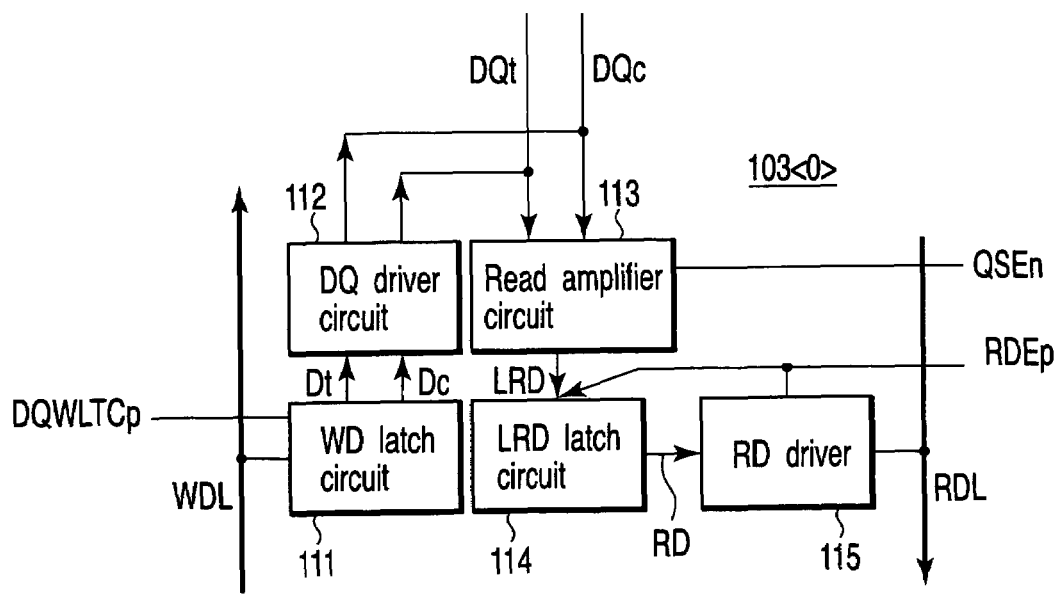
FIG. 4 is a block diagram that shows an example of an internal structure of a DQB block shown in FIG. 1.

For example, the DQB block 103<0> is composed, as shown in FIG. 4. In FIG. 4, a latch circuit 111 for write data WD is connected to the write global data line. The write data WD is latched by a latch control signal DQWLTCp and is converted to complementary data Dt, Dc. These complementary data Dt, Dc are supplied to local data lines DQt, DQc via a driver circuit 112 and are written in the selected memory block 104<0>.

On the other hand, complementary data, which are read out of the selected memory block 104<0>, are supplied to a read amplifier circuit 113 via the local data lines DQt, DQc and are amplified by a control signal QSEn. The amplified data are latched in a latch circuit 114 as local read-out data LRD. Then, in response to a control signal RDEp, the latched data are sent as read-out data RD to the global data line RDL via a driver circuit 115.

In the case where the memory macro with the structure shown in FIG. 1 is operated at high speed by a high-frequency clock, a time difference of one cycle of the clock is generally provided between each of the DQB blocks 103<0> to 103<i> and the I/O block 101 in either case of data write and data read. Thereby, it becomes possible to overcome a problem such as a difference in delay at the time of data transfer between the I/O block 101 and the DQB blocks 103<0> to 103<i>, which results from a difference in wiring length between the global data lines WDL and RDL.

Figure 2:
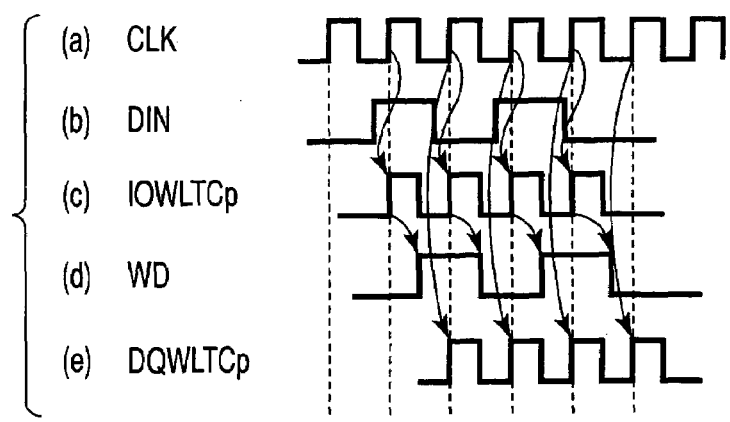
FIG. 2 is a timing chart for explaining a data write operation of the memory macro shown in FIG. 1.

Referring now to FIG. 2, an operation at the time of data write is described. Assume that a write data input DIN is supplied to the I/O block 101 at a timing shown in part (b) of FIG. 2, in relation to a clock CLK shown in part (a) of FIG. 2. In sync with the clock CLK, a write latch control signal IOWLTCp is output from the I/O control circuit 106, as shown in part (c) of FIG. 2. Thus, the input data DIN is latched in the I/O block 101 in sync with a leading edge of the clock CLK. Triggered by a rising edge of the write latch control signal IOWLTCp, the latched input data DIN is sent to the global data line WDL. The input data is then latched in any one of the DQB blocks 103<0> to 103<i> by a latch signal DQWLTCp shown in part (e) of FIG. 2, which is generated in sync with a leading edge of the next clock CLK. In this manner, a time difference, which corresponds to a period between a leading edge of a clock CLK and a leading edge of the next clock CLK, is provided between the latching of the input data DIN in the I/O block 101 and the latching of the input data DIN in the DQB block, 103<0> to 103<i>.

Figure 3:
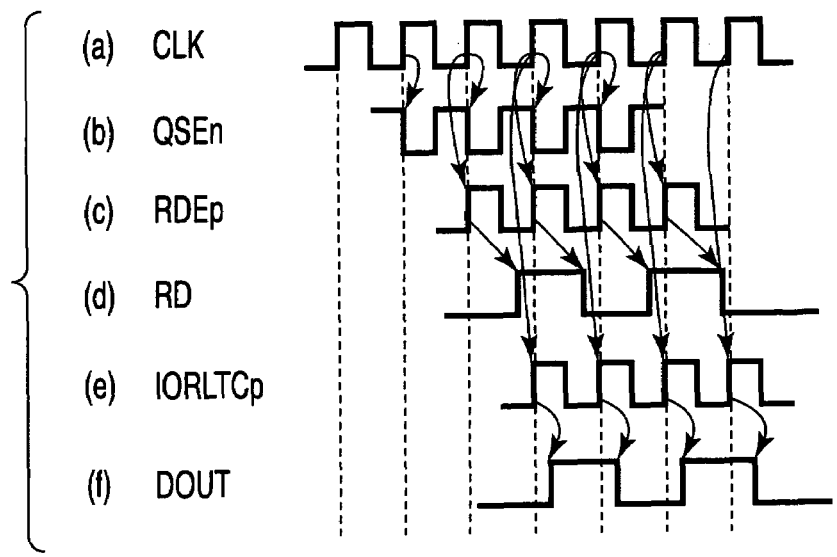
FIG. 3 is a timing chart for explaining a data read-out operation of the memory macro shown in FIG. 1.

Similarly, at the time of data read-out, as shown in FIG. 3, a time period of one cycle of the clock CLK is provided for the transfer of read-out data RD from the DQB block, 103<0> to 103<i>, to the I/O block 101. If a signal QSEn shown in part (b) of FIG. 3 is supplied, in sync with the clock CLK, to the read amplifier circuit 113 shown in FIG. 4, in the state in which complementary data are read out to the local data lines DQt, DQc, the complementary data are amplified in sync with a leading edge of the signal QSEn, that is, a trailing edge of the clock CLK, and the amplified data is latched as local data LRD. The local data LRD is further latched in the latch circuit 114 when a signal RDEp shown in part (c) of FIG. 3 is supplied in sync with a leading edge of the clock CLK. The latched data is sent out to the global data line RDL via the driver 115 as read-out data RD shown in part (d) of FIG. 3. The read-out data RD is latched in the I/O block 101 in sync with a leading edge of the clock CLK by a signal IORLTCp, shown in part (e) of FIG. 3, from the I/O control circuit 106. The latched data RD is output to the outside as a data output DOUT at a timing shown in part (f) of FIG. 3.

As has been described above, in the memory macro shown in FIG. 1, the time difference of one cycle of the clock is provided between the DQB block, 103<0> to 103<i>, and the I/O block 101. Thus, the DQB block, 103<0> to 103<i>, sends out read-out data RD to the global data line RDL in sync with a leading edge of the clock CLK, and the I/O block 101 latches the read-out data RD in sync with a leading edge of the clock CLK. Specifically, each of the DQB blocks 103<0> to 103<i> includes a two-stage data latch unit comprising the read amplifier circuit 113 and latch circuit 114. The latch circuit 114 latches the signal, which is latched by the read amplifier circuit 113 in sync with the trailing edge of the clock CLK, in sync with the leading edge of the clock CLK. Thereby, the read-out data RD is synchronized with the leading edge of the clock CLK.

Figure 5:
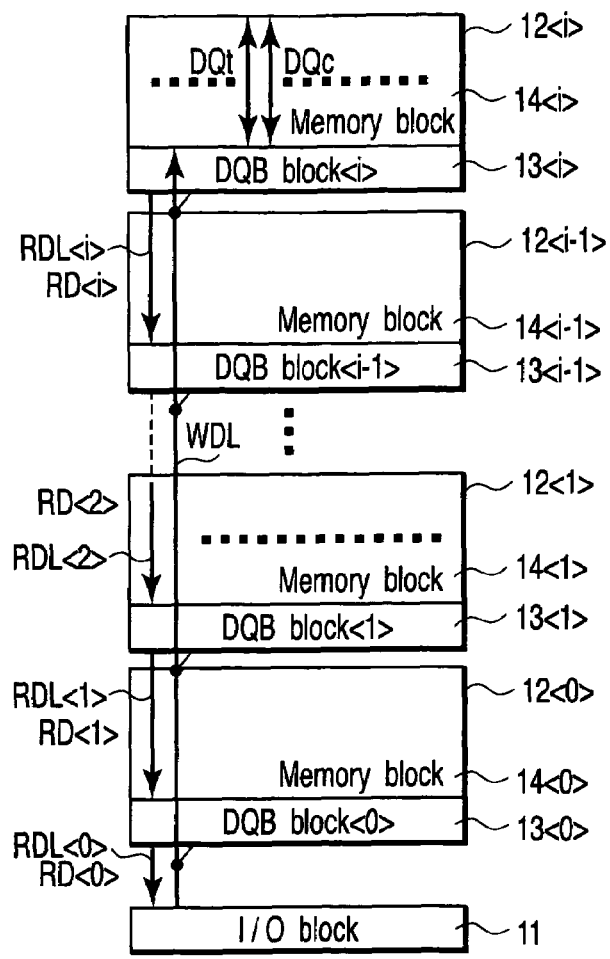
FIG. 5 is a block diagram that shows the entire structure of another reference example, which is a presupposed technique of the present invention.

FIG. 5 is a block diagram that schematically shows a reference example, which is based on the reference example of FIG. 1 and is configured to reduce the effect of an increase in global data line length that occurs when the number of sub-macros is increased in accordance with the increase in capacity of the memory macro, in particular, the effect of a wiring delay of the global data line at the time of read-out. In FIG. 5, attention has been paid to the relation in connection between the I/O block and each sub-macro by global data lines. Like the example shown in FIG. 1, control signals that are associated with the DQB blocks and I/O block are generated by the DQB block control circuit and I/O block control circuit.

The example of FIG. 5 will now be described in detail. Write data WD that is supplied from an external circuit is latched in an I/O block 11, or read-out data that is read out of the internal memory is latched in the I/O block 11. The I/O block 11 is commonly connected over a write global data line WDL to the DQB blocks 13<0>, 13<1>, ..., 13<i-1> and 13<i> that are data control units in memory sub-macros 12<0>, 12<1>, ..., 12<i-1> and 12<i>. The DQB block 13<i> is connected to the associated memory block 14<i> over complementary local data lines DQt, DQc. Similarly, the other DQB blocks 13<0>, 13<1>, ..., 13<i-1> are connected to the associated memory blocks over complementary local data lines.

In the reference example of FIG. 5, repeaters for read-out data are provided in the DQB blocks 13<0>, 13<1>, ..., 13<i-1> and 13<i>, and read-out global data lines are dividedly provided in the DQB blocks 13<0>, 13<1>, ..., 13<i-1> and 13<i> via the repeaters. For example, read-out data RD<0>, which is output from the repeater provided in the DQB block 13<0> that is closest to the I/O block 11, is supplied to the I/O block 11 via an individual global data line RDL<0>. Similarly, the other DQB blocks 13<1>, ..., 13<i-1> and 13<i> are provided with repeaters and are connected to the neighboring DQB blocks 13<0>, 13<1>, ..., 13<i-1> via individual global data lines RDL<1>, ..., RDL<i-1> and RDL<i>.

Figure 6:
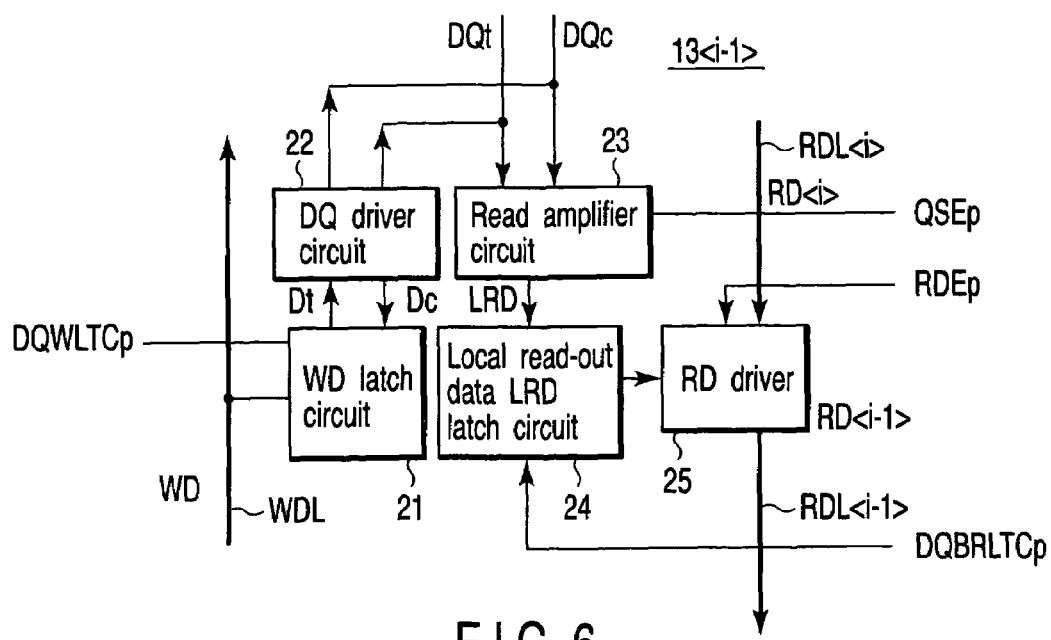
FIG. 6 is a block diagram that shows an example of an internal structure of a DQB block shown in FIG. 5.

For example, the DQB block 13<i-1> has an internal structure as shown in FIG. 6. In FIG. 6, a latch circuit 21 for write data WD is connected to the write global data line WDL. The write data WD is latched in the latch circuit 21 by a latch control signal DQWLTCp and is converted to complementary data Dt and Dc. The complementary data Dt and Dc are supplied to local data lines DQt and DQc via a driver circuit 22 and are written in the selected memory block 14<i-1>.

On the other hand, complementary data that have been read out of the selected memory block 14<i-1> are supplied to a read amplifier circuit 23 via the local data lines DQt and DQc, and are amplified by a control signal QSEn. The amplified data is latched in a latch circuit 24 as local read-out data LRD. Then, the latched data is delivered to the global data line RDL via a driver circuit 25 as read-out data RD in response to a control signal RDEp.

The driver circuit 25 also functions as a repeater for RDL<i>. The driver circuit 25 receives, via the global data line RDL<i>, the data RD<i> that is read out of the preceding-stage sub-macro 12<i> and re-drives the data RD<i>. The re-driven data is delivered to the next sub-macro via the global data line RDL<i-1>. Whether the RD driver 25 is to function as a driver circuit for the local read-out data LRD or is to function as a repeater circuit for the output from the preceding-stage DQB block is determined by switching on the basis of the state of the control signal RDEP. If the control signal RDEp is in an inactive state, the RD driver 25 functions as the repeater circuit for the output of the preceding-stage DQB block. If the control signal RDEp is in an active state, the RD driver 25 functions as the driving circuit for the local read-out data LRD.

Referring now to FIG. 7, a description is given of an example of the detailed structure of the read amplifier circuit 23, local RD latch circuit 24 and RD driver 25 shown in FIG. 6.

In the read amplifier circuit 23, one local data line DQc is connected to one end of a P-channel transistor 231, and the other local data line DQt is connected to one end of a P-channel transistor 232. The other end of the transistor 231 is connected to one input terminal of a NAND gate 233 via an internal data line Qc. The other end of the transistor 232 is connected to one input terminal of a NAND gate 234 via an internal data line Qt. The gates of the transistors 231 and 232 are connected to each other, and a connection node therebetween is supplied with a read amplifier driving signal QSEn.

Two P-channel sense transistors 235 and 236 are connected in series between the internal data lines Qc and Qt. In parallel with this transistor circuit, two N-channel sense transistors 237 and 238 are connected in series. The gates of the sense transistors 235 and 237, which are connected on the internal data line Qc side, are commonly connected to the other internal data line Qt, and the gates of the sense transistors 236 and 238 are commonly connected to the internal data line Qc. A connection node between the transistors 235 and 236 is supplied with a power supply voltage V. A connection node between the transistors 237 and 238 is grounded via an N-channel transistor 239. The aforementioned read amplifier driving signal QSEn is supplied to the gate of the transistor 239.

An output terminal of the NAND circuit 233 is connected to the other input terminal of the other NAND circuit 234, and an output terminal of the NAND circuit 234 is connected to the other input terminal of the NAND circuit 233. Thereby, a latch circuit with a flip-flop structure is formed. An output from the latch circuit is supplied to the next-stage LRD latch circuit 24 as local read-out data LRD.

The LRD latch circuit 24 includes a first latch circuit 241, which is formed by combining clocked inverters 243 and 241b and an inverter 241a, and a second latch circuit 242, which is formed by combining clocked inverters 244 and 242b and an inverter 242a. The clocked inverters 243 and 241b of the first latch circuit 241 are supplied with DQBRLTCp and DQBRLTCn as clocks, as shown in FIG. 1. The first latch circuit 241 receives local read-out data LRD in a time period in which the DQBRLTCp is at L level, and holds it in a time period in which the DQBRLTCp is at H level. The clocked inverters 244 and 242b of the second latch circuit 242 are supplied with DQBRLTCp and DQBRLTCn as clocks, as shown in FIG. 7. The second latch circuit 242 receives an output of the first latch circuit in a time period in which the DQBRLTCp is at H level, and holds it in a time period in which the DQBRLTCp is at L level. As a result, the LRD latch circuit 24 outputs the local read-out data LRD, which has been latched while the DQBRLTCp is at L level, to the RD driver 25 in sync with the leading edge of the DQBRLTCp, and holds this output data until the leading edge of the next DQBRLTCp.

Output data RDy of the latch circuit 242, together with a control signal RDEp that is delivered via a buffer circuit 245 comprising two-stage inverters, is delivered as output data of the latch circuit 24 to a NAND gate 251 that constitutes an input stage of the RD driver 25. An output terminal of the NAND gate 251 is connected to one input terminal of a NAND gate 252. The other input terminal of the NAND gate 252 is supplied with read-out data RD<i> from the preceding-stage memory sub-macro 12<i> via the global data line RDL<i>. Output data from the NAND gate 252 is output as read-out data RD<i-1> via an inverter 253.

Figure 8:
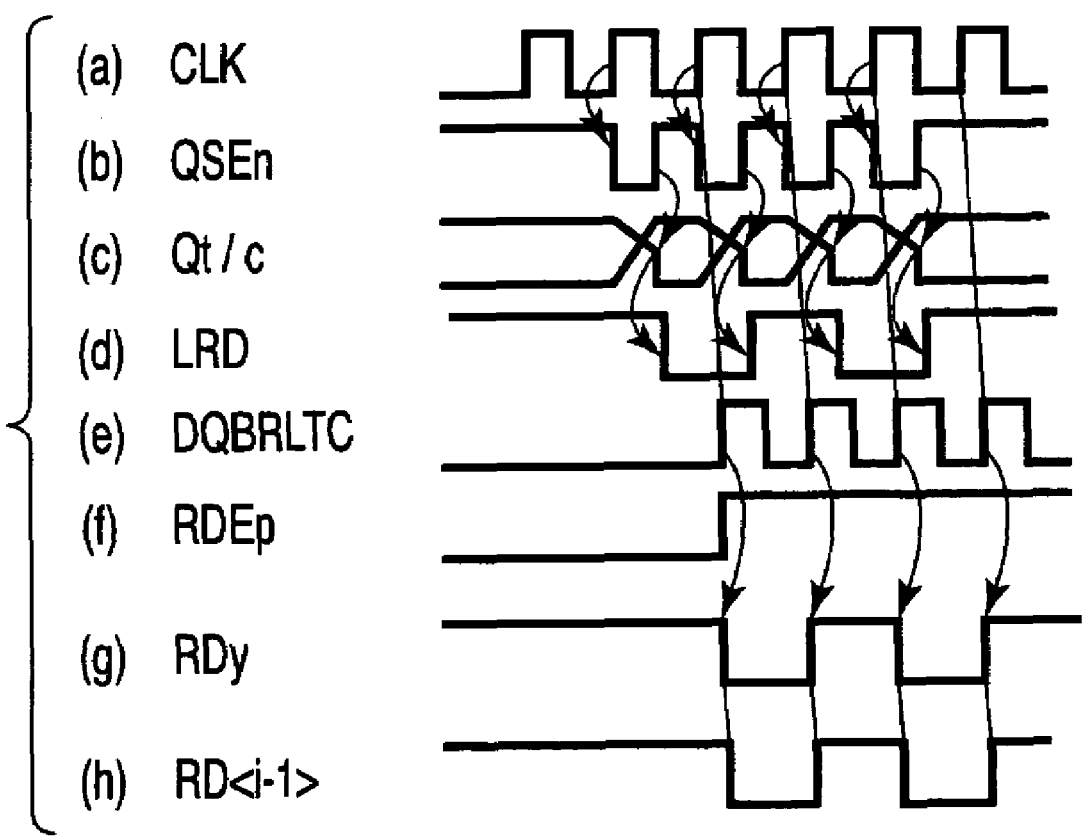
FIG. 8 is a timing chart illustrating the operation of the memory macro of the reference example shown in FIG. 5.

Next, the operation of the circuits shown in FIG. 6 and FIG. 7 is described referring to a timing chart of FIG. 8. At a time of data read-out from the memory block 14<i-1>, a read amplifier driving signal QSEn shown in part (b) of FIG. 8 is generated in sync with, and in opposite phase to, a clock CLK shown in part (a) of FIG. 8. In a period in which the read amplifier driving signal QSEn is at L level, the P-channel transistors 231 and 232 are rendered conductive, and complementary data that are read out to the local data lines DQc and DQt are supplied to the internal data lines Qc and Qt and are delivered to the amplifier circuit comprising the transistors 235 to 238 through the data lines Qc and Qt. At this time, the N-channel transistor 239 that is connected to a ground potential is rendered non-conductive.

At a timing when the signal QSEn rises to H level, the transistor 239 is rendered conductive. For example, if the internal data line Qc is set at H level and the internal data line Qt is set at L level by the read-out complementary data, the transistors 235 and 238 are rendered conductive and the transistors 236 and 237 are rendered non-conductive. As a result, as shown in part (c) of FIG. 8, the complementary data on the internal data lines Qc and Qt are amplified by the transistors 235 and 238 and restored to the read-out data. The restored data is latched as local data LRD, as shown in part (d) of FIG. 8, in the latch circuit that is composed of the NAND circuits 233 and 234.

In this state, a read-out data latch signal DQBRLTC shown in part (e) of FIG. 8 is activated, with a leading edge of the clock CLK acting as a trigger. Actually, the read-out data latch signal DQBRLTC is supplied as complementary clocks DQBRLTCp and DQBRLTCn to the LRD latch circuit 24. Thereby, the local read-out data LRD is supplied to the other input terminal of the NAND gate 251 of the driver 25 via the latch circuits 241 and 242, as shown in part (g) of FIG. 8. At this time, since the DQB block 13<i-1> is selected, the control signal RDEp is activated at the same time, as shown in part (f) of FIG. 8, and is held at H level. Thus, the read-out data RDy shown in part (g) of FIG. 8 passes through the gate 251 and goes to the NAND gate 252. In this case, for the reason to be stated later, the RD<i> is at H level and thus the read-out data that is delivered to the NAND gate 252 is output as read-out data RD<i-1>, as shown in part (h) of FIG. 8, via the inverter 253.

On the other hand, when the DQB block 13<i-1> is not selected, the control signal RDEp is fixed at L level, and accordingly the output of the NAND gate 251 is fixed at H level. As a result, the read-out data RD<i> from the preceding-stage DQB block 13<i> is output via the NAND gate 252 and inverter 253, and the RD driver 25 functions as a repeater for the data RD<i>. In FIG. 5, no preceding-stage DQB block is present for the DQB block 13<i>. Thus, in the RD driver 25 of the DQB block 13<i>, the NAND gate 252 is supplied with a power supply voltage in place of output data. Hence, if the DQB block 13<i> is in the non-selected state, the RD<i> is set at H level. When the DQB block 13<i-1> is selected, the NAND gate 252 can receive an output from the NAND gate 251 in the RD driver 25 of the selected DQB block 13<i-1>.

In the reference example shown in FIG. 1, the memory macro is divided into sub-macros, and the data line that connects the DQB block and the memory block is divided as local data lines. Thereby, the wiring delay is reduced. However, as a result, the number of DQB blocks increases and the circuit area increases. On the other hand, in the reference example of FIG. 5, the global data lines, over which the read-out data is transmitted, are connected via the repeaters at the respective DQB blocks. Thus, even if many memory sub-macros constitute the memory macro that is connected to the I/O block, it is possible to eliminate a problem such as erroneous read-out due to a CR delay of the global data lines RDL. In this reference example, however, as shown in FIG. 7, three-stage latch circuits are required in each DQB block. The number of latch circuits is greater than that in the reference example of FIG. 1, and the circuit area of the DQB block further increases. In the case of a memory macro in which a great number of DQB blocks are used in accordance with the increase in memory capacity, such an area penalty becomes a bottleneck to the increase in capacity. This point is improved in a first embodiment that is to be described below, and a high-speed, large-capacity memory macro is realized.

FIRST EMBODIMENT

Figure 9:
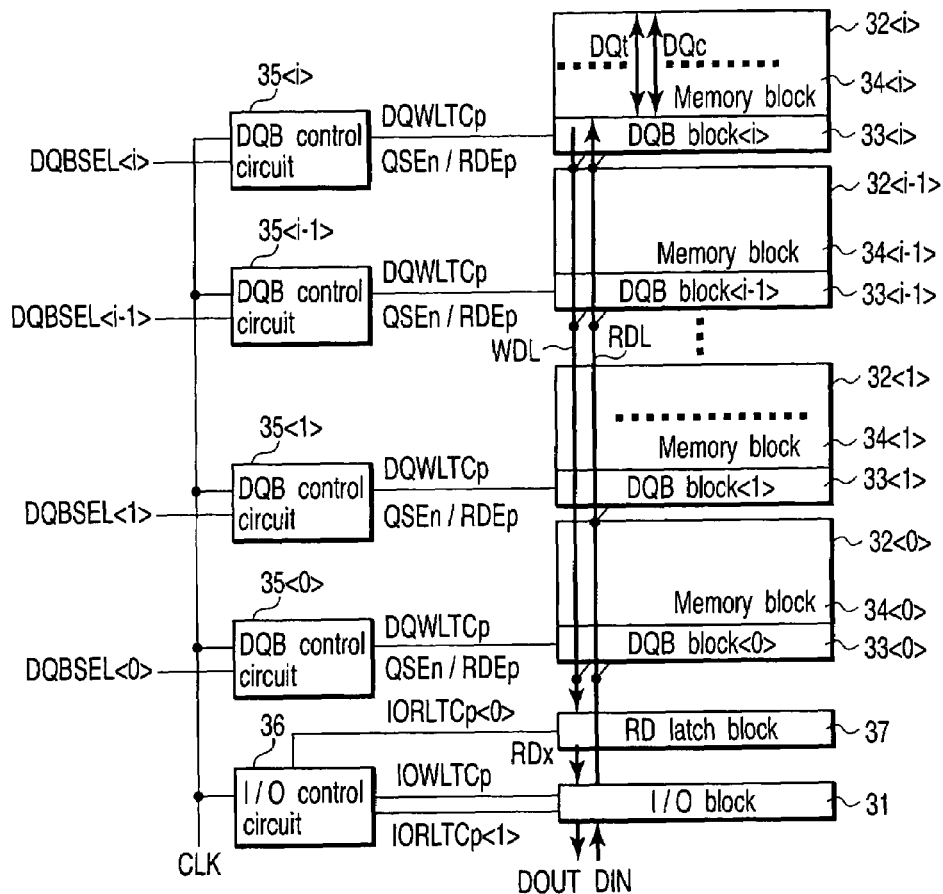
FIG. 9 is a block diagram that shows the entire structure of a first embodiment of the present invention.

FIG. 9 is a block diagram that shows the entire structure of a memory macro according to a first embodiment of the invention. In FIG. 9, an I/O block 31 is configured to successively neighbor a plurality of memory sub-macros 32<0>, 32<1>, ..., 32<i> via a latch block 37 for read-out data RD, which is to be described later. The memory sub-macro 32<0> comprises a DQB block 33<0> that is a data control unit, and an associated memory block 34<0>. Similarly, the other memory sub-macros 32<1>, ..., 32<i> comprise DQB blocks 33<1> to 33<i> and memory blocks 34<1> to 34<i>, respectively. The operations of the DQB blocks 33<0> to 33<i> are controlled by control signals DQWLTCp, QSEn and RDEp from DQB control circuits 35<0> to 35<i> that are operated by DQB block selection signals DQBSEL<0> to DQBSEL<i> coming from the outside and a clock CLK. The data latch operation of the I/O block 31 is controlled by latch control signals IOWLTCp and IORLTCp<1> from an I/O control circuit 36. The I/O control circuit 36 further outputs a latch control signal IORLTCp<0> to the RD latch block 37, and the latch control signal IORLTCp<0> controls the latch operation of the RD latch block 37 for latching the read-out data RD. This latch operation will be described later in detail.

At a time of data write, DIN, that is, write data WD supplied from outside, is sent to the global data line WDL via the I/O block 31. Further, the write data WD is selectively supplied to the DQB blocks 33<0> to 33<i> of the memory sub-macros 32<0> to 32<i>, and written in any one of the associated memory blocks 34<0> to 34<i>.

At a time of data read-out, read-out data RD, which is read out of a selected one of the memory blocks 34<0> to 34<i>, is sent to a read-out global data line RDL via the associated DQB block. After the read-out data RD is latched in the latch block 37 for read-out data RD, it is latched in the I/O block 31 and output as output data DOUT to the outside.

Figure 10:
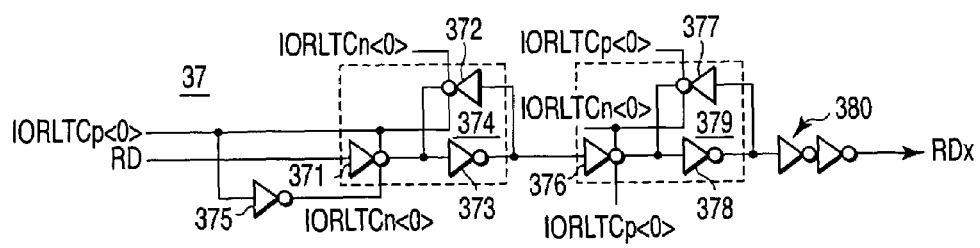
FIG. 10 is a block diagram that shows a specific example of the structure of an RD latch block shown in FIG. 9.

The latch block 37 for the read-out data RD is structured, for example, as shown in FIG. 10. In the circuit shown in FIG. 10, the RD latch block 37 includes a latch circuit 374, which is formed by combining clocked inverters 371 and 372 and an inverter 373, and a latch circuit 379, which is formed by combining clocked inverters 376 and 377 and an inverter 378. The clocked inverters 371 and 372 of the latch circuit 374 are supplied with IORLTCp<0> and a latch signal IORLTCn<0>, which is generated by inverting the IORLTCp<0> by means of the inverter 375, as clocks, as shown in FIG. 10. The latch circuit 374 receives data RD that is read out to the global data line RDL in a time period in which the IORLTCp<0> is at L level, and holds it in a time period in which the IORLTCp<0> is at H level. The clocked inverters 376 and 377 of the latch circuit 379 are supplied with IORLTCp<0> and IORLTCn<0> as clocks, as shown in FIG. 10. The latch circuit 379 receives an output of the latch circuit 374 in a time period in which the IORLTCp<0> is at H level, and holds it in a time period in which the IORLTCp<0> is at L level. As a result, the latch block 37 for data RD outputs, at the leading edge of the IORLTCp<0>, the data RD, which is read out to the global data line RDL and is received in the time period in which the IORLTCp<0> is at L level, as RDx via a buffer circuit 380 that comprises two series-connected inverters, and holds the RDx until the leading edge of the next IORLTCp<0>.

Figure 11:
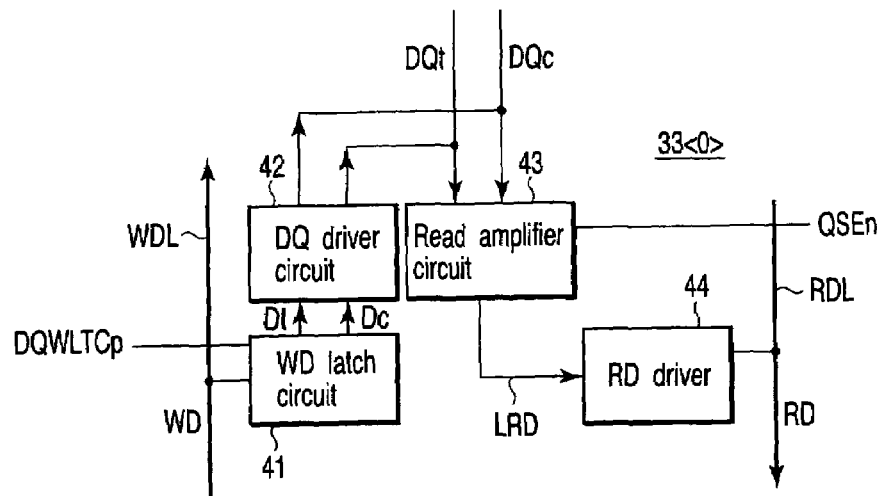
FIG. 11 is a block diagram that shows a specific example of the structure of a DQB block shown in FIG. 9.

For example, the DQB block 33<0> is composed, as shown in FIG. 11. In FIG. 11, a latch circuit 41 for write data WD is connected to the write global data line WDL. The write data WD is latched by a latch control signal DQWLTCp and is converted to complementary data Dt, Dc. These complementary data Dt, Dc are supplied to local data lines DQt, DQc via a DQ driver circuit 42 and are written in the selected memory block 34<0>. The other DQB blocks 33<1> to 33<i> are similarly composed.

On the other hand, complementary data, which are read out of the selected memory block 34<0>, are supplied to a read amplifier circuit 43 via the local data lines DQt, DQc and are amplified by a control signal QSEn. The amplified data are sent, as local read-out data LRD, to the global data line RDL via an RD driver circuit 44. The other DQB blocks 33<1> to 33<i> are similarly constructed.

Figure 12:
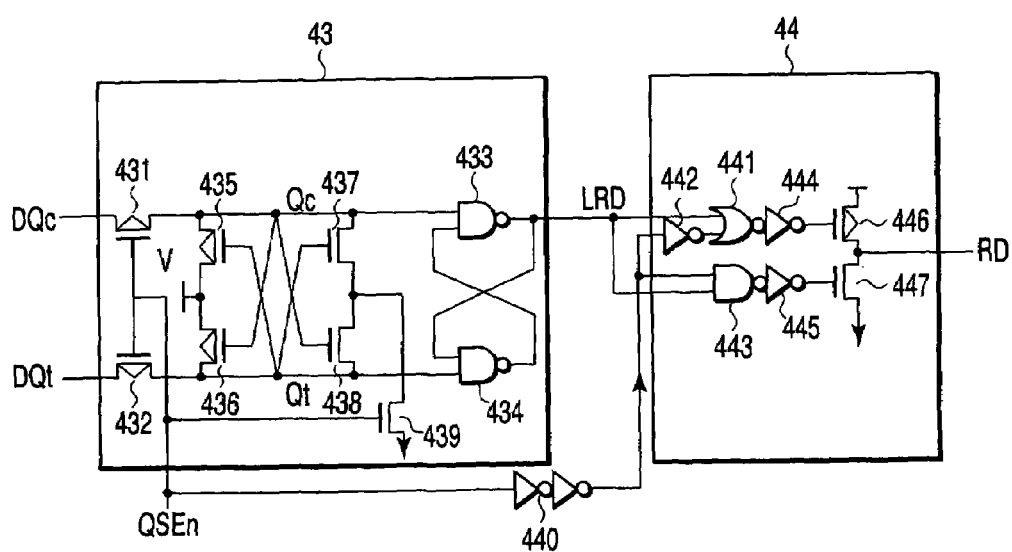
FIG. 12 is a block diagram that shows a specific example of the internal structures of blocks shown in FIG. 11.

Referring now to FIG. 12, a detailed description is given of an example of the internal structures of the read amplifier circuit 43 and driver 44 for read-out data RD, which are shown in FIG. 11. In the read amplifier circuit 43, one local data line DQc is connected to one end of a P-channel transistor 431, and the other local data line DQt is connected to one end of a P-channel transistor 432. The other end of the transistor 431 is connected to one input terminal of a NAND gate 433 via an internal data line Qc. The other end of the transistor 432 is connected to one input terminal of a NAND gate 434 via an internal data line Qt. The gates of the transistors 431 and 432 are connected to each other, and a connection node therebetween is supplied with a read amplifier driving signal QSEn.

Two P-channel sense transistors 435 and 436 are connected in series between the internal data lines Qc and Qt. In parallel with this transistor circuit, two N-channel sense transistors 437 and 438 are connected in series. The gates of the sense transistors 435 and 437, which are connected on the internal data line Qc side, are commonly connected to the other internal data line Qt, and the gates of the sense transistors 436 and 438 are commonly connected to the internal data line Qc. A connection node between the transistors 435 and 436 is supplied with a power supply voltage V. A connection node between the transistors 437 and 438 is grounded via an N-channel transistor 439. The aforementioned read amplifier driving signal QSEn is supplied to the gate of the transistor 439. The read amplifier driving signal QSEn is further supplied to the RD driver 44 via a buffer circuit 440 that comprises two inverters.

An output terminal of the NAND circuit 433 is connected to the other input terminal of the other NAND circuit 434, and an output terminal of the NAND circuit 434 is connected to the other input terminal of the NAND circuit 433. Thereby, a latch circuit with a flip-flop structure is formed. An output from the latch circuit is supplied to the next-stage RD driver 44 as local read-out data LRD.

The RD driver 44 comprises a NOR gate 441 that is supplied with the local read-out data LRD from the read amplifier circuit 43; an inverter 442 that is supplied with the control signal QSEn from the buffer circuit 440; a NAND gate 443 that is supplied with the data LRD and signal QSEn; inverters 444 and 445 that are supplied with an output from the NOR gate 441 and an output from the NAND gate 443, respectively; and a P-channel transistor 446 and an N-channel transistor 447, which have gates supplied with outputs from the inverters 444 and 445, respectively. Read-out data RD is output from a connection node between the transistors 446 and 447.

Figure 13:
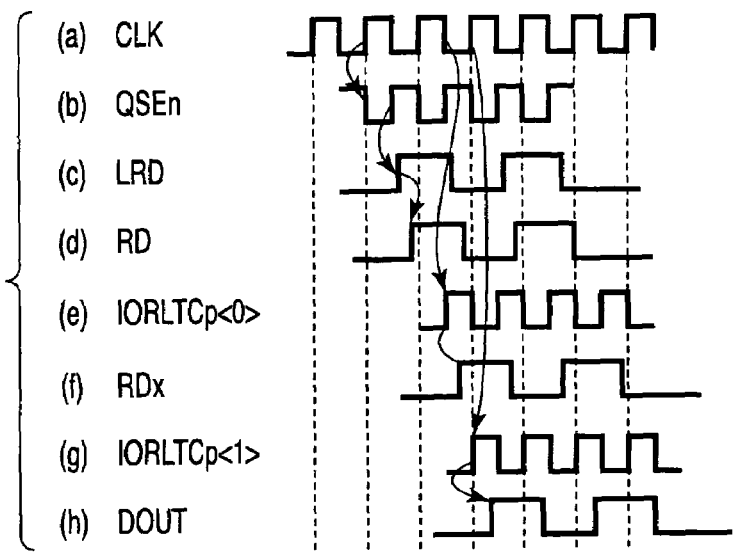
FIG. 13 is a timing chart for explaining the operation of the memory macro of the first embodiment.

Next, the operation of the memory macro according to the first embodiment shown in FIG. 9 to FIG. 12 is described referring to a timing chart of FIG. 13. Assume that data is to be read out of the memory block 34<0>. A read amplifier driving signal QSEn shown in part (b) of FIG. 13 is generated in sync with, and in opposite phase to, a clock CLK shown in part (a) of FIG. 13. In a period in which the read amplifier driving signal QSEn is at L level, the P-channel transistors 431 and 432 shown in FIG. 12 are rendered conductive, and complementary data that are read out to the local data lines DQc and DQt are supplied to the internal data lines Qc and Qt and are delivered to the amplifier circuit comprising the transistors 435 to 438 through the data lines Qc and Qt. At this time, the N-channel transistor 439 that is connected to a ground potential is rendered non-conductive.

At a timing when the signal QSEn shown in part (b) of FIG. 13 rises to H level in accordance with the L level of the trailing edge of the clock CLK shown in part (a) of FIG. 13, the transistor 439 is rendered conductive. For example, if the internal data line Qc is set at H level and the internal data line Qt is set at L level by the read-out complementary data, the transistors 435 and 438 are rendered conductive and the transistors 436 and 437 are rendered non-conductive. As a result, the complementary data on the internal data lines Qc and Qt are amplified by the transistors 435 and 438 and restored to the read-out data. The restored data is latched as local data LRD, as shown in part (c) of FIG. 13, in the latch circuit that is composed of the NAND circuits 433 and 434.

The latched local data LRD is supplied to one input terminal of the NOR gate 441 and to one input terminal of the NAND gate 443. The control signal QSEn from the buffer circuit 440 is supplied to the other input terminal of the NOR gate 441 via the inverter 442, and the control signal QSEn is also supplied directly to the other input terminal of the NAND gate 443. Thus, in accordance with the H level and L level of the local data LRD, the output levels of the inverters 444 and 445 are set at H or L, as shown in part (d) of FIG. 13, and the read-out data RD is obtained as an output of the RD driver 44. As described above, the read-out data RD is the data that is output at a timing in sync with the trailing edge of the clock CLK.

In this state, a control signal IORLTCp<0> shown in part (e) of FIG. 13 is delivered from the I/O control circuit 36 to the RD latch block 37 having the structure shown in FIG. 10, with a leading edge of the next clock CLK acting as a trigger. Then, in sync with the leading edge of the IORLTCp<0>, the clocked inverter 371 is closed and at the same time the clocked inverter 376 is opened, and read-out data RDx is output. The data RDx is held until the leading edge of the next IORLTCp<0>, that is, until the trailing edge of the one after the next CLK.

The latched data RDx is delivered to the latch circuit of the I/O block 31, which has the same structure as shown in FIG. 10. This latch circuit is controlled, like the latch circuit shown in FIG. 10, by a control signal IORLTCp<1> shown in part (g) of FIG. 13 and a complementary signal IOR-LTCn<1> thereof. The control signal IORLTCp<1> is a signal that is triggered by the leading edge of the clock CLK, as shown in part (g) of FIG. 13. Accordingly, an output DOUT from the I/O block 31, as shown in part (h) of FIG. 13, becomes data that is further shifted by a ½ cycle of the clock CLK, relative to the data RDx. Data read-out from the other DQB blocks is executed in like manner. In the case where the memory macro with the structure shown in FIG. 9 is operated at high speed by a high-frequency clock, a time difference of one cycle (or several cycles) of the clock is provided between each of the DQB blocks 33<0> to 33<i> and the I/O block 31 or the latch block 37 for data RD in either case of data write and data read. Thereby, it becomes possible to overcomes a problem such as a difference in delay at the time of data transfer between the I/O block 31 or the latch block 37 for data RD, and the DQB blocks 33<0> to 33<i>, which results from a difference in wiring length of the global data line WDL or RDL. In the reference example shown in FIG. 1, however, in either case of data write and data read-out, the difference between the leading edge of a clock CLK and the leading edge of the next clock CLK is set at one cycle. Hence, as has already been described, two-stage latch circuits are required in each DQB block at the time of read-out. Consequently, the area penalty increases. By contrast, in the above-described first embodiment, the one-stage latch circuit, which is triggered by the leading edge of the clock CLK, is provided in the DQB block, and the RD latch block 37 is provided at the front stage of the I/O block 31. The data is once latched by the latch circuit that is triggered by the trailing edge of the clock CLK, and then delivered to I/O block 31. Unlike the structure of FIG. 1, the DQB block does not need to have two-stage latch circuits. Even if a large-capacity memory macro is constructed, an increase in area penalty of the DQB block can be suppressed. The number of cycles of the clock CLK between the activation of the control signal QSEn, shown in part (b) of FIG. 13, and the output of the data DOUT, shown in part (h) of FIG. 13, is the same as in the example of FIG. 1, which has been described referring to FIG. 3, and there is no difference in data read-out time.

SECOND EMBODIMENT

Figure 14:
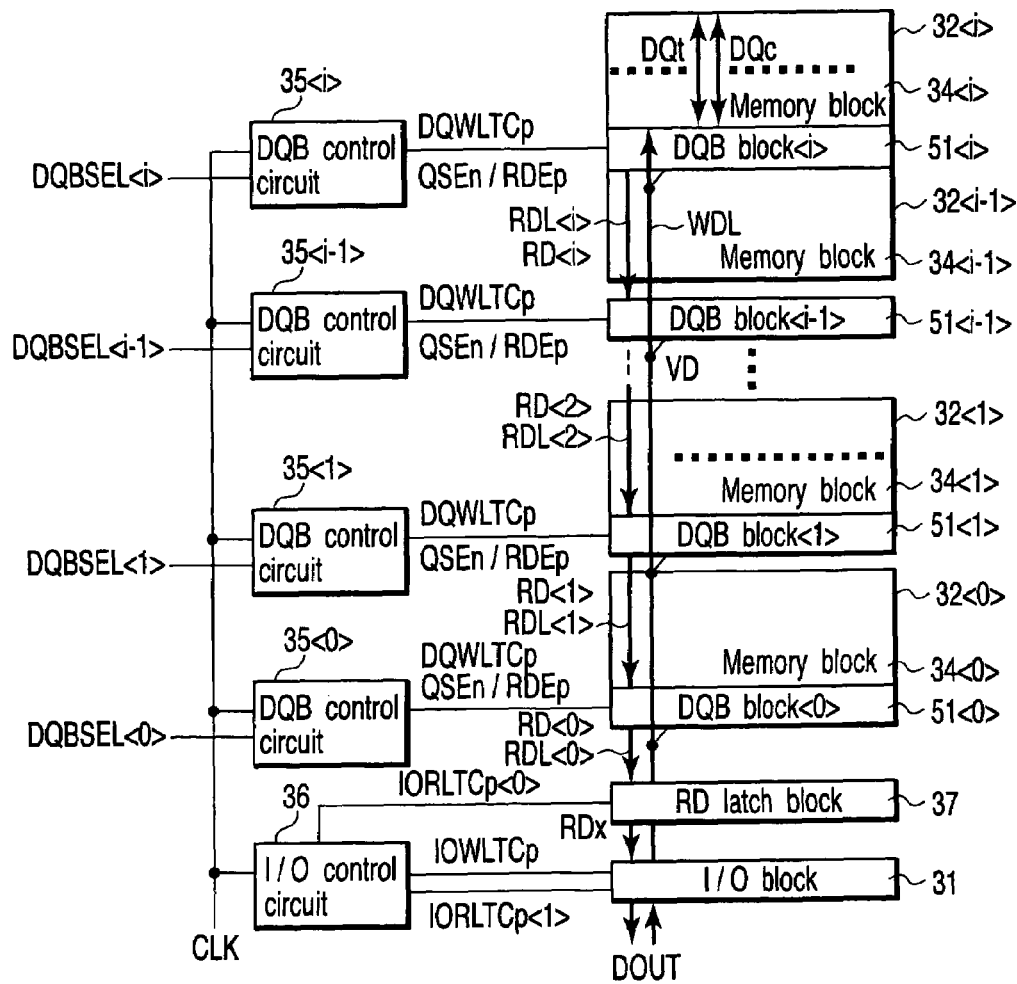
FIG. 14 is a block diagram that shows the entire structure of a second embodiment of the present invention.

FIG. 14 is a block diagram that shows the entire structure of a memory macro according to a second embodiment of the invention. In FIG. 14, the parts common to those in FIG. 9 are denoted by like reference numerals, and a description thereof is omitted. The differences from the embodiment of FIG. 9 are the structure of DQB blocks 51<0> to 51<i>, and the structure of read-out global data lines RDL<0> to RDL<i> that are connected to the DQB blocks 51<0> to 51<i>. In the embodiment of FIG. 14, like the reference example shown in FIG. 5, the selected DQB block sends the data RD, which is read out of the associated memory block, to a subsequent DQB block, while the non-selected block functions as a repeater for the read-out data from the preceding DQB block. Thus, the read-out global data line, unlike the embodiment of FIG. 9, is not commonly connected to all the DQB blocks, but is formed as a plurality of data lines that are individually connected to the DQB blocks.

Figure 15:
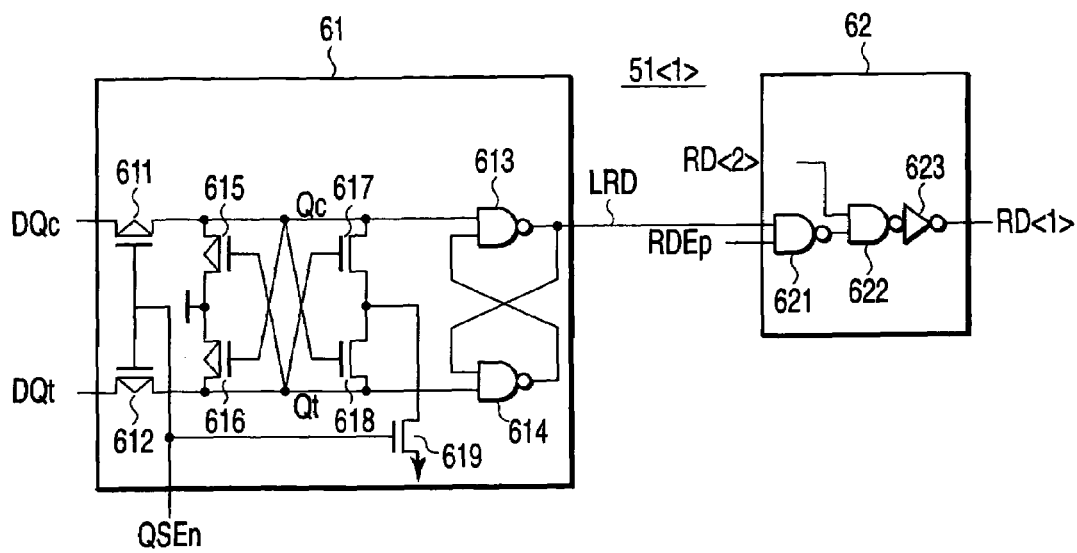
FIG. 15 is a block diagram that shows a specific example of the structure of a DQB block shown in FIG. 14.

As is shown in FIG. 15, the DQB block 51<1>, for instance, includes a read amplifier circuit 61 and an RD driver 62 that is connected to the read amplifier circuit 61. The relationship in connection between the WD latch circuit and DQ driver circuit relating to the write operation is the same as shown in FIG. 11. In FIG. 15, one local data line DQc, which is connected to the read amplifier circuit 61, is connected to one end of a P-channel transistor 611, and the other local data line DQt is connected to one end of a P-channel transistor 612. The other end of the transistor 611 is connected to one input terminal of a NAND gate 613 via an internal data line Qc. The other end of the transistor 612 is connected to one input terminal of a NAND gate 614 via an internal data line Qt. The gates of the transistors 611 and 612 are connected to each other, and a connection node therebetween is supplied with a read amplifier driving signal QSEn.

Two P-channel sense transistors 615 and 616 are connected in series between the internal data lines Qc and Qt. In parallel with this transistor circuit, two N-channel sense transistors 617 and 618 are connected in series. The gates of the sense transistors 615 and 617, which are connected on the internal data line Qc side, are commonly connected to the other internal data line Qt, and the gates of the sense transistors 616 and 618 are commonly connected to the internal data line Qc. A connection node between the transistors 615 and 616 is supplied with a power supply voltage V. A connection node between the transistors 617 and 618 is grounded via an N-channel transistor 619. The aforementioned read amplifier driving signal QSEn is supplied to the gate of the transistor 619.

An output terminal of the NAND circuit 613 is connected to the other input terminal of the other NAND circuit 614, and an output terminal of the NAND circuit 614 is connected to the other input terminal of the NAND circuit 613. Thereby, a latch circuit with a flip-flop structure is formed. An output from the latch circuit that is local read-out data LRD, along with the control signal RDEp, is supplied to a NAND gate 621 that constitutes an input stage of the next-stage RD driver 62. An output terminal of the NAND gate 621 is connected to one input terminal of a NAND gate 622. Read-out data RD<2> from the preceding-stage memory sub-macro is supplied to the other input terminal of the NAND gate 622 via the global data line RDL<2>, as shown in FIG. 14. Output data from the NAND gate 622 is output as read-out data RD<1> via an inverter 623.

In the second embodiment, like the first embodiment, when read-out data RD from the memory block is output to the read-out global data lines RDL<0> to RDL<i>, the read-out data RD is latched in the latch circuit, with the trailing edge of the clock CLK being used as a trigger. Thus, the number of latch circuits in the DQB block can be decreased, and a high-speed, large-capacity memory macro can be realized. Next, the operation of the embodiment shown in FIG. 14 and FIG. 15 is described referring to FIG. 16.

Figure 16:
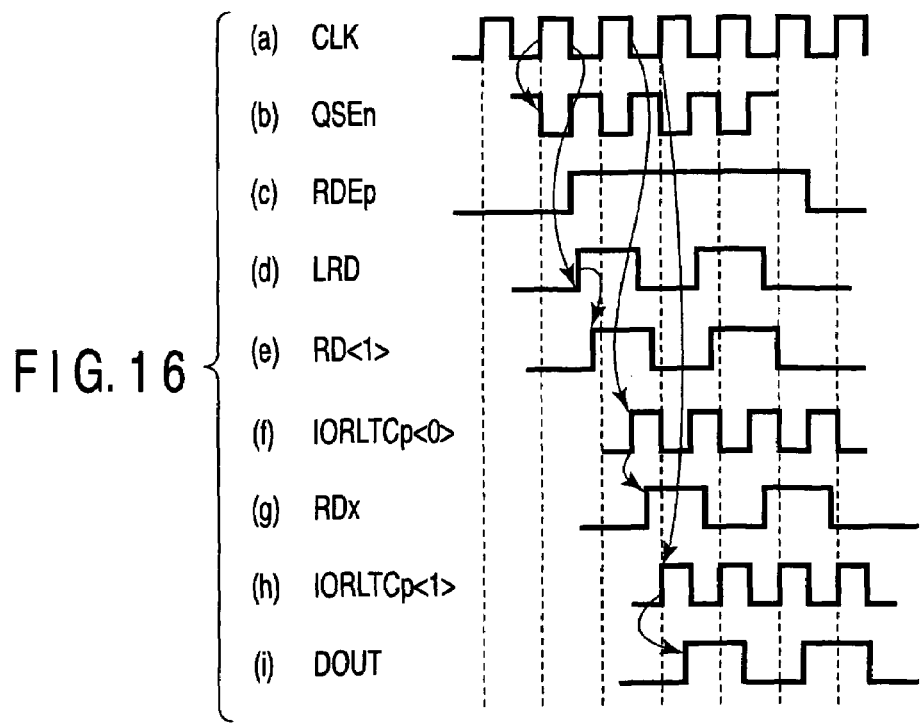
FIG. 16 is a timing chart for explaining the operation of the memory macro of the second embodiment.
Figure 17:
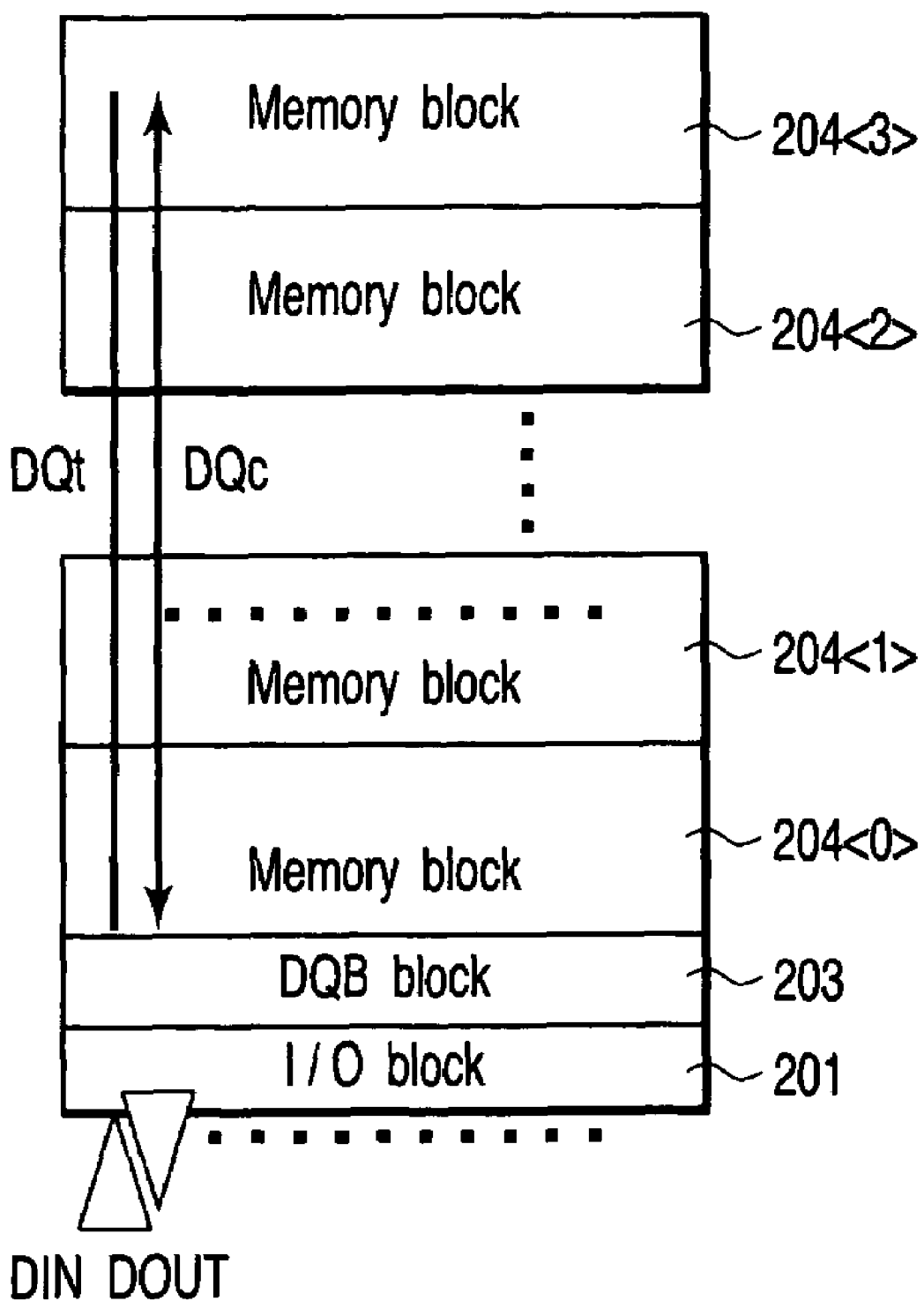
FIG. 17 is a block diagram that shows the structure of a conventional large-capacity memory macro.

In the DQB block 51<1> shown in FIG. 14 and FIG. 15, a read amplifier driving signal QSEn shown in part (b) of FIG. 16 is generated in sync with, and in opposite phase to, a clock CLK shown in part (a) of FIG. 16. In a period in which the read amplifier driving signal QSEn is at L level, the P-channel transistors 611 and 612 shown in FIG. 15 are rendered conductive, and complementary data that are read out to the local data lines DQc and DQt are supplied to the internal data lines Qc and Qt and are delivered to the amplifier circuit comprising the transistors 615 to 618 through the internal data lines Qc and Qt. At this time, the N-channel transistor 619 that is connected to a ground potential is rendered non-conductive.

At a timing when the signal QSEn shown in part (b) of FIG. 16 rises to H level in accordance with the L level of the trailing edge of the clock CLK shown in part (a) of FIG. 16, the transistor 619 is rendered conductive. For example, if the internal data line Qc is set at H level and the internal data line Qt is set at L level by the read-out complementary data, the transistors 615 and 618 are rendered conductive and the transistors 616 and 617 are rendered non-conductive. As a result, the complementary data on the internal data lines Qc and Qt are amplified by the transistors 615 and 618 and restored to the read-out data. The restored data is latched as local data LRD, as shown in part (d) of FIG. 16, in the latch circuit that is composed of the NAND circuits 613 and 614.

The latched local data LRD is supplied to one input terminal of the NAND gate 621 in the RD driver 62. A control signal RDEp at H level, shown in part (c) of FIG. 16, is supplied to the other input terminal of the NAND gate 621. Thus, in accordance with the H level and L level of the local data LRD, the output level of the NAND gate 621 is set at H or L, and an output RD<1> of the RD driver 62 is obtained, as shown in part (e) of FIG. 16. As described above, the read-out output RD<1> is the data that is output at a timing in sync with the trailing edge of the clock CLK. In this case, since the DQB block 51<1> is selected, the read-out data RD<2> from the preceding stage is fixed at H level. Accordingly, the output data from the NAND gate 621 is output as the read-out data RD<1> of the DQB block 51<1> via the NAND gate 622 and inverter 623.

In this state, a control signal IORLTCp<0> shown in part (f) of FIG. 16 is delivered from the I/O control circuit 36, which is shown in FIG. 14, to the RD latch block 37 having the structure shown in FIG. 10, with the trailing edge of the next clock CLK being used as a trigger. Then, in sync with the leading edge of the control signal IORLTCp<0>, the clocked inverter 371 is closed and at the same time the clocked inverter 376 is opened, and read-out data RDx is output. The data RDx is held until the leading edge of the next IORLTCp<0>, that is, until the trailing edge of the one after the next CLK.

The data RDx is delivered to the latch circuit of the I/O block 31, which has the same structure as shown in FIG. 10. This latch circuit is controlled, like the latch circuit shown in FIG. 10, by a control signal IORLTCp<1> shown in part (h) of FIG. 16 and a complementary signal IORLTCn<1> thereof. The control signal IORLTCp<1> is a signal that is triggered by the leading edge of the clock CLK, as shown in part (h) of FIG. 16. Accordingly, an output DOUT from the I/O block 31, as shown in part (i) of FIG. 16, becomes data that is further shifted by a ½ cycle of the clock CLK, relative to the data RDx. Data read-out from the other DQB blocks is executed in like fashion.

As has been described above, in the second embodiment, the RD driver provided in the DQB block, 51<0> to 51<i>, functions as a repeater, and the number of stages of latch circuits in the DQB block is less than that in the reference example shown in FIG. 5. Therefore, it is possible to suppress an increase in area of the DQB block circuit due to an increase in capacity of the memory macro.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
an interface unit that executes transmission/reception of data with an external circuit;
a data memory unit including a write data line, a read-out data line, a data control unit connected to the interface unit via the write data line, and a memory block connected to the data control unit; and
a read-out latch block that is connected between the read-out data line and the interface unit,
wherein the data control unit outputs data, which is read out of the memory block, to the read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

2. The semiconductor memory device according to claim 1, wherein the interface unit delivers write data from the external circuit to the write data line with a leading edge of a clock being used as a trigger, and the data control unit receives the write data on the write data line with a leading edge of another clock, which is generated at least one cycle after the leading edge of the aforementioned clock, being used as a trigger.

3. The semiconductor memory device according to claim 1, wherein the data control unit includes a read amplifier circuit that amplifies the read-out data from the memory block, and a read driver that supplies output data from the read amplifier circuit to the read-out data line, and the read amplifier circuit includes a single-stage latch circuit that holds the read-out data for one cycle with a trailing edge of the clock being used as a trigger.

4. The semiconductor memory device according to claim 3, wherein the read driver amplifies and outputs the read-out data when the data control unit is selected, and the read driver functions as a repeater, when the data control unit is in a non-selected state, which amplifies and outputs read-out data from a data control unit of a preceding stage.

5. The semiconductor memory device according to claim 4, wherein the read-out data line comprises a plurality of individual read-out data lines that connect a plurality of data control units, and the read driver is connected as the repeater to the data control unit of a preceding stage and to the data control unit of a subsequent stage over the individual read-out data line.

6. The semiconductor memory device according to claim 5, wherein the read driver is controlled by a control signal to effect switching between local read-out data from the read amplifier circuit and read-out data from the data control unit of the preceding stage, and amplifies and outputs the read-out data that is selected by the switching.

7. The semiconductor memory device according to claim 6, wherein the read driver includes:
a first logic circuit that has one input terminal supplied with the local read-out data from the read amplifier circuit, and the other input terminal supplied with the control signal, and passes the local read-out data when the data control unit is selected; and
a second logic circuit that has a first input terminal supplied with an output from the first logic circuit, and a second input terminal supplied with read-out data from the data control unit of the preceding stage, and passes the read-out data from the data control unit of the preceding stage when the data control unit is in a non-selected state.

8. The semiconductor memory device according to claim 3, wherein the read amplifier circuit includes:
first and second switches that receive complementary data, which are read out of the memory block, and deliver the complementary data to first and second internal data lines in coincidence with a trailing edge of the clock;
an amplifier circuit that amplifies and restores the complementary data on the first and second internal data lines to the output data; and
a first latch circuit that latches the output data from the amplifier circuit.

9. The semiconductor memory device according to claim 1, wherein the data memory unit is configured such that a plurality of memory sub-macros each having a memory block and an associated data control unit are connected to the interface unit via the write data line, and each of the memory sub-macros is provided with an associated read/write control circuit that is supplied with a memory sub-macro selection signal.

10. The semiconductor memory device according to claim 9, wherein the read/write control circuit, which is selected by the memory sub-macro selection signal, outputs a write latch signal and a read enable signal, and the associated data control unit is selectively driven.

11. The semiconductor memory device according to claim 1, wherein an I/O control circuit, which outputs a read/write latch signal in sync with the clock, is provide in association with the interface circuit, the interface circuit latches read/write data in accordance with the read/write latch signal, and the read-out latch block latches the read-out data on the basis of the read-out latch signal in coincidence with a trailing edge of the clock.

12. The semiconductor memory device according to claim 1, wherein the read-out latch block includes a latch circuit that is controlled by complementary latch control signals, which are generated in sync with the clock.

13. A semiconductor memory device comprising:
an interface unit that executes transmission/reception of data with an external circuit;
a data memory unit including a write data line, a read-out data line, a plurality of data control units commonly connected to the interface unit via the write data line, and a plurality of memory blocks each connected to the data control units, respectively; and
a read-out latch block that is connected between the read-out data line and the interface unit,
wherein the read-out data line is commonly connected to the plurality of data control units, a selected one of the data control units outputs read data, which is read out of a corresponding one of the memory blocks associated with the selected one of the data control units, to the read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

14. The semiconductor memory device according to claim 13, wherein each of the data control units and the corresponding memory block are connected via a pair of local data lines.

15. The semiconductor memory device according to claim 13, wherein the data control unit includes a read amplifier circuit that amplifies the read-out data from the memory block, and a read driver that supplies output data from the read amplifier circuit to the read-out data line, and the read amplifier circuit includes a single-stage latch circuit that holds the read-out data for one cycle with a trailing edge of the clock being used as a trigger.

16. The semiconductor memory device according to claim 13, wherein the read driver amplifies and outputs the read-out data when the data control unit is selected, and the read driver functions as a repeater, when the data control unit is in a non-selected state, which amplifies and outputs read-out data from a data control unit of a preceding stage.

17. A semiconductor memory device comprising:
an interface unit that executes transmission/reception of data with an external circuit;
a data memory unit including a write data line, a plurality of read-out data lines, a plurality of data control units commonly connected to the interface unit via the write data line, a plurality of memory blocks connected to the plurality of data control units, respectively, and each of the plurality of read-out data lines being connected between a preceding data control unit and a nest data control unit; and
a read-out latch block that is connected between the interface unit and one of the plurality of data control units provided adjacent to the interface unit,
wherein a selected data control unit of the data control units outputs data, which is read out of a memory block corresponding to the selected data control unit, to the corresponding read-out data line with a trailing edge of a clock being used as a trigger, the read-out latch block latches the data with a trailing edge of another clock, which is generated at least one cycle after the trailing edge of the aforementioned clock, being used as a trigger, and the interface unit outputs the data to the external circuit with a leading edge of still another clock, which follows the aforementioned another clock, being used as a trigger.

18. The semiconductor memory device according to claim 17, wherein each of the data control units and the corresponding memory block are connected via a pair of local data lines.

19. The semiconductor memory device according to claim 17, wherein the data control unit includes a read amplifier circuit that amplifies the read-out data from the memory block, and a read driver that supplies output data from the read amplifier circuit to the read-out data line, and the read amplifier circuit includes a single-stage latch circuit that holds the read-out data for one cycle with a trailing edge of the clock being used as a trigger.

20. The semiconductor memory device according to claim 17, wherein each of the plurality of data control units which is not selected acts as a repeater for transmitting the read data from the preceding memory block to a next stage data control unit.

* * * * *